United States Patent [19]

Wakatsuki et al.

[11] Patent Number: 5,049,809
[45] Date of Patent: Sep. 17, 1991

[54] SENSING DEVICE UTILIZING MAGNETO ELECTRIC TRANSDUCERS

[75] Inventors: Noboru Wakatsuki; Shigemi Kurashima, both of Kawasaki; Nobuyoshi Shimizu; Michiko Endoh, both of Yokohama; Yuji Kojima, Chigasaki; Akira Tanaka; Hideaki Yoda, both of Kawasaki, all of Japan

[73] Assignee: Fujitsu Limited, Kawasaki, Japan

[21] Appl. No.: 180,120

[22] Filed: Apr. 11, 1988

[30] Foreign Application Priority Data

Apr. 9, 1987 [JP] Japan .................................. 62-87749
Jun. 16, 1987 [JP] Japan ................................ 62-149404
Sep. 16, 1987 [JP] Japan ................................ 62-231700
Dec. 25, 1987 [JP] Japan ................................ 62-333134

[51] Int. Cl.$^5$ ........................................... G01R 33/06
[52] U.S. Cl. ........................... 324/117 R; 324/117 H; 338/32 R
[58] Field of Search ............... 324/117 R, 117 H, 252, 324/127; 338/32 R; 307/309

[56] References Cited

U.S. PATENT DOCUMENTS

| | | | |
|---|---|---|---|
| 2,836,791 | 5/1958 | Kaplan | 324/117 R |
| 2,906,945 | 9/1959 | Weiss | 324/117 H |
| 2,946,955 | 7/1960 | Kuhrt | 324/117 H |
| 3,312,898 | 4/1967 | Browne, Jr. | 324/117 R |
| 3,418,575 | 12/1968 | Spindle | 324/117 R |
| 3,931,566 | 1/1976 | Pask et al. | 338/32 R |
| 4,053,829 | 10/1977 | Maruo | 338/32 R |
| 4,097,802 | 6/1978 | Mahopac et al. | 338/32 R |
| 4,385,273 | 5/1983 | Lienhard et al. | 324/117 R |
| 4,464,625 | 8/1984 | Lienhard et al. | 324/117 R |
| 4,506,214 | 3/1985 | Lienhard et al. | 324/117 R |
| 4,754,219 | 6/1988 | Milkovic | 324/142 |
| 4,801,830 | 1/1989 | Ogino et al. | 338/32 R |
| 4,839,600 | 6/1989 | Kuurstra | 324/117 R |

FOREIGN PATENT DOCUMENTS

| | | | |
|---|---|---|---|
| 0002078 | 1/1979 | Japan | 338/32 R |
| 0099479 | 8/1979 | Japan | 324/117 H |
| 0115174 | 9/1979 | Japan | 324/117 H |
| 2004117A | 8/1978 | United Kingdom . | |

OTHER PUBLICATIONS

Elektronik, vol. 33, No. 13, Jun. 1984, Munchen DE, pp. 78–81, H. Hencke.
Journal of Physics E. Scientific Instruments, vol. 19, No. 7, Jul. 1986, Ishing, Bristol GB, pp. 502–515, W. Kwiatkowski et al., "The Permalloy Magnetoresistive Sensors Properties and Applications".
Patent Abstracts of Japan, vol. 8, No. 192, Sep. 4, 1984.
IEEE Transactions on Magnetics, vol. Mag11, No. 5, Sep. 1975, New York, pp. 1215–1217, K. E. Kuijk et al., "The Barber Pole, Linear Magnetoresistive Head".
Smith, K.; "Magnetometer on a . . . ", Electronics; vol. 54; No. 2; Jan. 27, 1981; pp. 78, 80; copy in 324-252.

Primary Examiner—Ernest F. Karlsen
Attorney, Agent, or Firm—Staas & Halsey

[57] ABSTRACT

A sensing device for measuring electric current and electric power including a plurality of magneto-electric transducers for detecting a magnetic field about a conductor carrying the electric current. The magneto-electric transducers can include Barber-Pole type elements, each element being positioned on a substrate at approximately the same distance from the central point of a substrate.

35 Claims, 19 Drawing Sheets

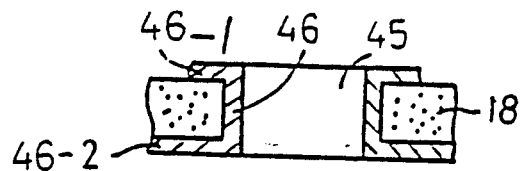
FIG. 21
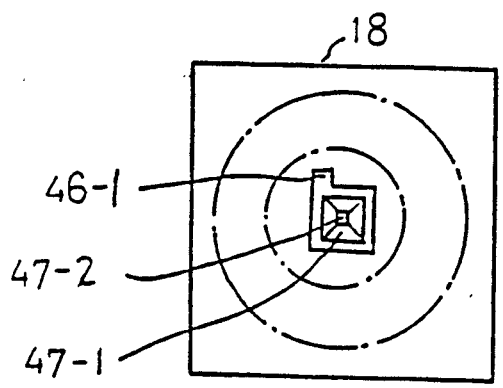 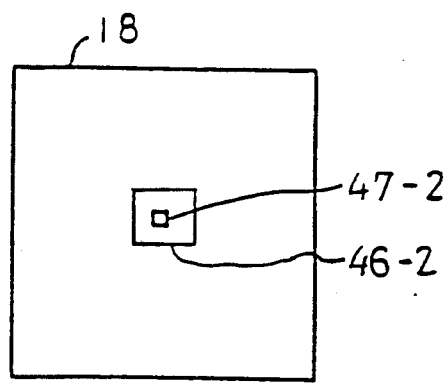
FIG. 22(a)   FIG. 22(b)
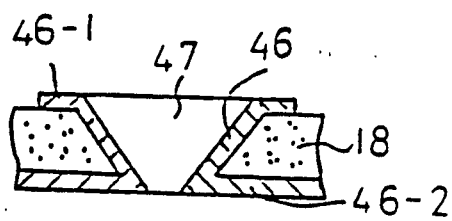
FIG. 22(c)

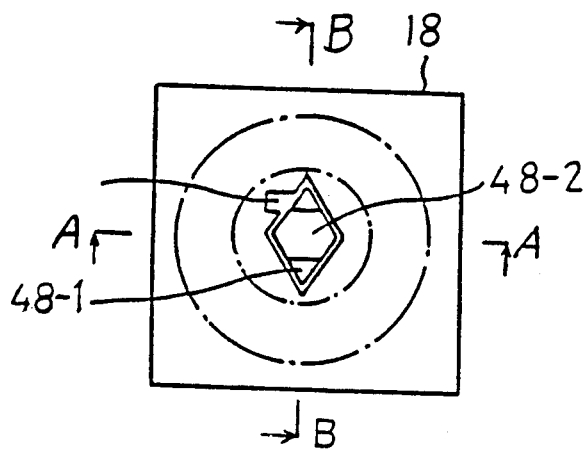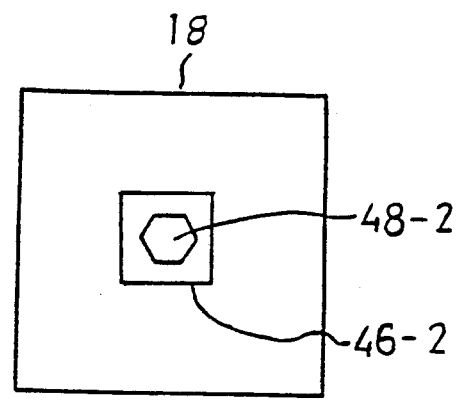
FIG. 23(a)   FIG. 23(b)
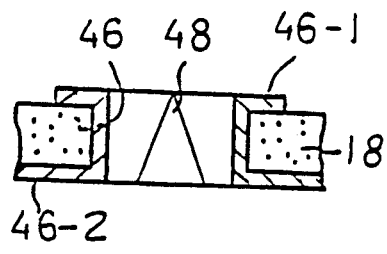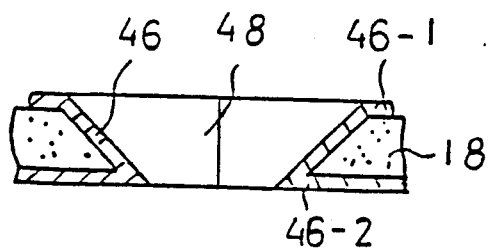
FIG. 23(c)   FIG. 23(d)

Output from Amp

SENSING DEVICE UTILIZING MAGNETO ELECTRIC TRANSDUCERS

BACKGROUND OF THE INVENTION

1. Field of the Invention

This invention relates to a sensing device utilizing magneto electric transducers for measuring electric current or electric power. The sensing device according to this invention has a particular feature of compact size and high precision and can be used for both direct current and alternating current.

2. Description of the Related Art

There are many types of instruments used to measure electric current. Generally speaking, electric current is detected or measured by an instrument using a moving coil or a rotatable iron piece that indicate the measured data. These elements are placed between permanent magnet pole pieces or current carrying fixed coils. Such instruments have a comparatively large size, and is subject to insulation problems, especially when used in a high voltage circuit. Another type of instrument uses a current transformer. This instrument can measure large currents without the problem of insulation. This other instrument is, however, large and cannot easily measure a current having high frequency components.

Recently, magneto electric transducers, such as a Hall-effect element, and magneto-resistive elements have been used to measure electric current. These elements measure electric current with-out being directly inserted into a load circuit. Instead, these elements detect a magnetic field generated about a conductor through which a load current is flowing. These elements are therefore isolated from the load circuit, and have many applications in detecting and measuring.

A Hall-effect element has an electric current flowing through a material (usually a semiconductor material) located in a magnetic field that is perpendicular to the direction of the current. The magnetic field produces a voltage perpendicular to both the current and the magnetic field. When the magnetic field applied to the Hall-effect element is produced by a load current to be measured, the voltage output by the Hall-effect element is dependent on the load current and the characteristics of Hall-effect element itself.

A magneto-resistive element has a current flowing through a ferromagnetic material. The resistance of the material changes when the material is subjected to a magnetic field. When the magnetic field is generated by a load current, the current through the magneto-resistive element changes depending on the load current.

FIG. 1 illustrates an example current measuring instrument using a magneto-resistive element. This instrument is disclosed in Japanese Tokukaisho 59-79860 by Matsumoto. FIG. 1, an electric current to be measured flows through a wire 1. FIG. 1 illustrates the instrument with the electric current flowing in a direction into the paper. The magneto-resistive layer 2 comprises a ferromagnetic material such as Fe-Ni alloy. The layer 2 is formed in a strip shape on an insulating substrate 5, and two terminals 3, 4 are formed on both ends of the magneto-resistive layer 2. A magnetic core 6 is positioned about the wire 1 so that a magnetic field generated around the wire 1 can easily form a magnetic loop 7 which flows through the magnetic core 6 and the magneto-resistive layer 2. The resistance between the terminals 3 and 4 can be measured by applying an constant current to the layer 2 and measuring the voltage drop across the terminals 3 and 4. The measured voltage and applied current define the resistance. Resistance changes can be detected when a magnetic field is generated by a load current flowing through the wire 1 by, for example, detecting changes in the current. The magnitude of the load current can therefore be determined from the amount of resistance change.

A current measuring instrument such as illustrated in FIG. 1 requires a relatively large magnetic core 6. In addition, the ambient (e.g., the earth's magnetic field), causes errors in current measurements of this instrument. This is because the ambient magnetic field causes unwanted changes in the resistance of a layer 2.

In a similar way, electric current can be measured using a Hall-effect element which is shown in FIG. 2. A constant voltage source V connected across terminals Ta causes a small current i to flow through a Hall-effect element 8. A load current I flows through terminals Ta' and generates a magnetic field B vertical to the Hall-effect element 8. A measurement device 9 detects the Hall voltage induced across the Hall-effect element; the Hall voltage being perpendicular to both the current i and the magnetic field B.

The Hall-effect element shown in FIG. 2 can measure electric power by connecting terminals Ta to a power source which simultaneously supplies a load current through terminals Ta'. The induced Hall voltage (which is proportional to the electric power), detected by 9, can be measured. The detected Hall voltage is proportional to power because the current i through Hall-effect element 8 is proportional to the voltage V of power source and the applied magnetic field B is proportional to the load current I. When a DC power source is used, a DC power output is directly obtained. On the other hand, when an AC power source is used, the Hall voltage varies with a frequency that is double the frequency of the AC power source. This is because both the magnetic field direction and the direction of the current flow in the Hall-effect element reverse each half cycle. When the Hall voltage is averaged, it is proportional to electric power.

When a Hall-effect element is used in a measuring instrument, it is necessary to shield the element from the outside or ambient magnetic fields, especially from the terrestrial or earth's magnetic field. As a result, Hall-effect instruments are large and bulky.

SUMMARY OF THE INVENTION

It is an object of the present invention to provide a simple and compact sensing device for electric current.

It is another object of the invention to provide a sensing device using a magneto electric transducer.

It is a further object of the invention to provide a sensing device which can be used to sense signals having a wide frequency range, from DC to a high frequency.

It is still another object of the invention to provide a compact sensing device which can sense electric power and electric current.

To achieve the above and other objects, the present invention provides a sensing device comprising a substrate having a central point; and a plurality of magneto-electric transducers, each positioned on the substrate at substantially the same distance from the central point and connected to another one of the magneto-electric transducers.

BRIEF DESCRIPTION OF THE DRAWINGS

FIG. 21 is a partial cross-sectional view of a through-hole formed in a substrate;

FIGS. 22(a) through 22(c) respectively illustrate a top view, a bottom view, and a partial cross-sectional view of a through-hole in a silicon substrate formed by an anisotropic etching process;

FIGS. 23(a) through 23(d) respectively illustrate a top view, a bottom view, and two partial cross-sectional views of a through-hole in a silicon substrate which is formed by an anisotropic etching process different from that producing the structure of FIGS. 22(a) through 22(c);

DETAILED DESCRIPTION OF THE PREFERRED EMBODIMENTS

Figure 1:
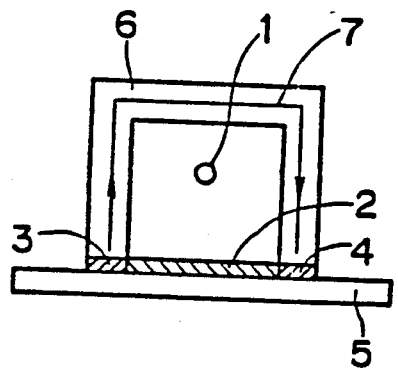
FIG. 1 is a plan view of a prior art magneto-resistive element.
Figure 2:
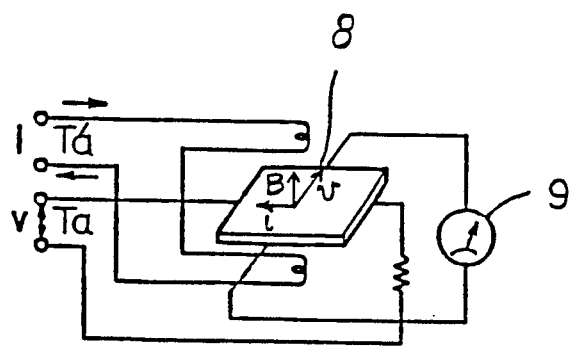
FIG. 2 is a schematic view of a prior art current and power measuring circuit.
Figure 3:
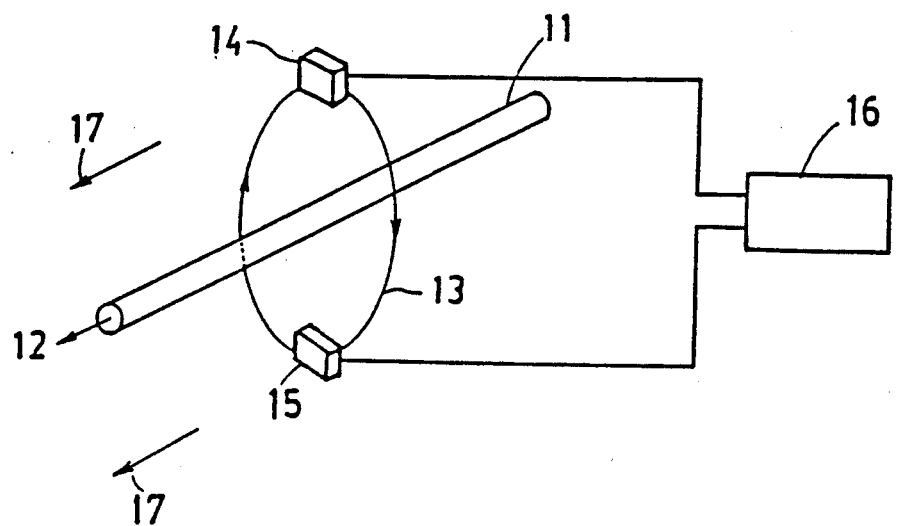
FIG. 3 schematically illustrates the present invention.

FIG. 3 schematically illustrates the present invention. In FIG. 3, an electric current to be measured 12, flows through a conductive wire 11, and generates a magnetic field 13 around the conductive wire 11. As an example of the invention, FIG. 3 shows magneto-electric transducers 14 and 15 arranged at the same radius from the conductive wire 11 and positioned to oppose each other. A combining means 16 is connected to receive output signals from the magneto-electric transducers (14, 15). If the magneto-electric transducers 14 and 15 have the same characteristics and are subjected to the magnetic field 13, then each transducer will provide the same output signal, such as a voltage. Therefore, if the combining means 16 comprises a differential amplifier, then when the magneto-electric transducers 14 and 15 are subjected to the magnetic field 13, the output of the differential amplifier would correspond to double the output of one of the magneto-electric transducers (14, 15).

An ambient magnetic field such as the earth's magnetic field does not disturb the arrangement shown in FIG. 3. This is because, for example, the influence of the ambient magnetic field on the transducer 14 is opposite the influence on transducer 15. As a result, the respective outputs of the two transducers (14, 15) due to the ambient magnetic field will be the opposite of each other. These outputs will therefore be cancelled in a differential amplifier.

Figure 4:
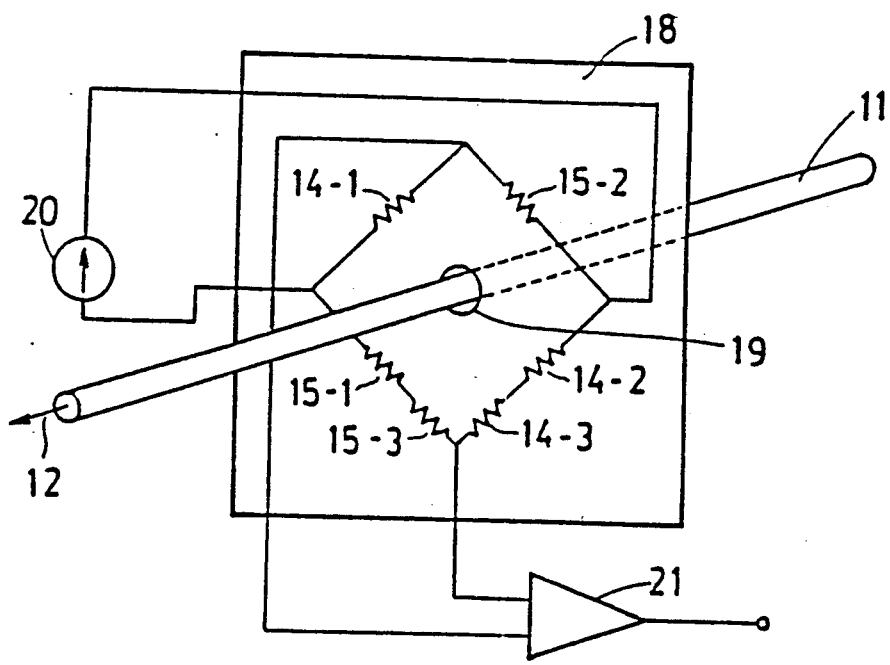
FIG. 4 schematically illustrates a sensing device embodying the present invention.

FIG. 4 schematically illustrates a sensing device embodying the present invention. In FIG. 4, a plurality of magneto-electric transducers such as magneto-resistive elements 14-1 through 14-3 and 15-1 through 15-3 are connected to form a bridge. These magneto-resistive elements preferably comprise a Barber-pole type element as discussed below.

FIG. 4 illustrates a highly sensitive arrangement that is not affected by an ambient magnetic field. When no current flows through the conductive wire 11, the bridge is balanced with a current provided by a constant voltage source 20. When current flows through the conductive wire 11, it generates a magnetic field around conductive wire 11. This magnetic field causes a resistance increase of magneto-resistive elements 14-1, and 14-2 and a resistance decrease of magneto-resistive elements 15-1 and 15-2, or vice versa, because these four elements are formed for an application for the bridge circuit. Then, the equilibrium of the bridge balance is lost, and amplifier 21 outputs the signal proportional to the current 12. As noted above, the 12 flowing through the conductive wire 11 is the only disturbance which places the bridge in an unbalanced state. Each of the magneto-resistive elements is positioned at the same radius from the conductive wire 11.

The magneto-resistive elements are formed on a substrate 18 comprising, for example, glass or silicon. The substrate 18 has the through-hole 19 formed about a central point of the substrate 18. The through-hole 19 is formed in a central portion of the bridge circuit, and an amplifier 21 is connected to the bridge and amplifies the unbalanced current flowing through the bridge.

The magneto-resistive elements are formed on the substrate 18 by depositing magneto-resistive material on the substrate. The material is then patterned by common photolithography techniques. Additional magneto-resistive elements 14-3 and 15-3 are also formed at this time and used to adjust the balance of the bridge when no current is flowing through the conductive wire 11.

The operation of the circuit shown in FIG. 4 is as follows. Magneto-resistive elements 14-1 and 14-2 are arranged so that a magnetic field generated by a current 12 flowing in the conductive wire 11 changes the resistance of these elements in an opposite direction to the resistance change that the magnetic field induces in the magneto-resistive elements 15-1 and 15-2. Consequently, when the current 12 flows through the conductive wire 11, the bridge circuit becomes unbalanced and the amplifier 21 (combining means) provides an output proportional to the current 12. An AC current can flow through the conductive wire 11. In this case, the output of amplifier 21 is an alternating signal proportional to the alternating current 12.

Figure 5:
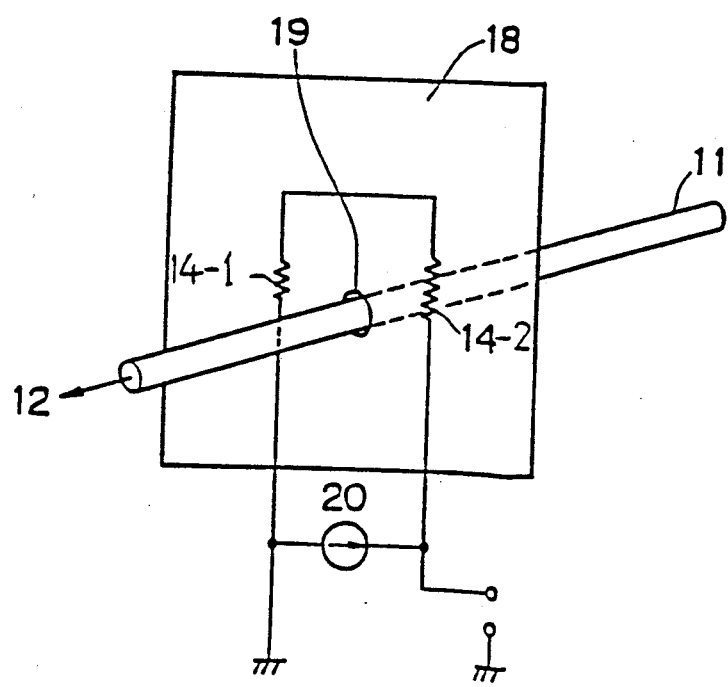
FIG. 5 schematically illustrates another sensing device embodying the present invention.

FIG. 5 schematically illustrates another sensing device embodying the present invention. FIG. 5 illustrates opposing magneto-resistive elements 14-1 and 14-2 formed on a substrate 18. The magneto-resistive elements are each positioned at the same distance (radius) from the through-hole 19. As shown in FIG. 5, the magneto-resistive elements 14-1 and 14-2 are connected in series. As described below, the magneto-resistive elements 14-1 and 14-2 are arranged so that a magnetic field generated by the current 12 affects the element 14-1 in the same manner as the element 14-2. A constant current source 20 is connected across the elements 14-1 and 14-2 and the voltage drop across the elements 14-1 and 14-2 (which depends upon the total resistance value of these elements) is measured. The measured resistance value changes when a magnetic field generated by an electric current 12 is applied to the circuit. Therefore, by measuring the voltage across the series connected elements, the strength of the current 12 can be detected.

Figure 6:
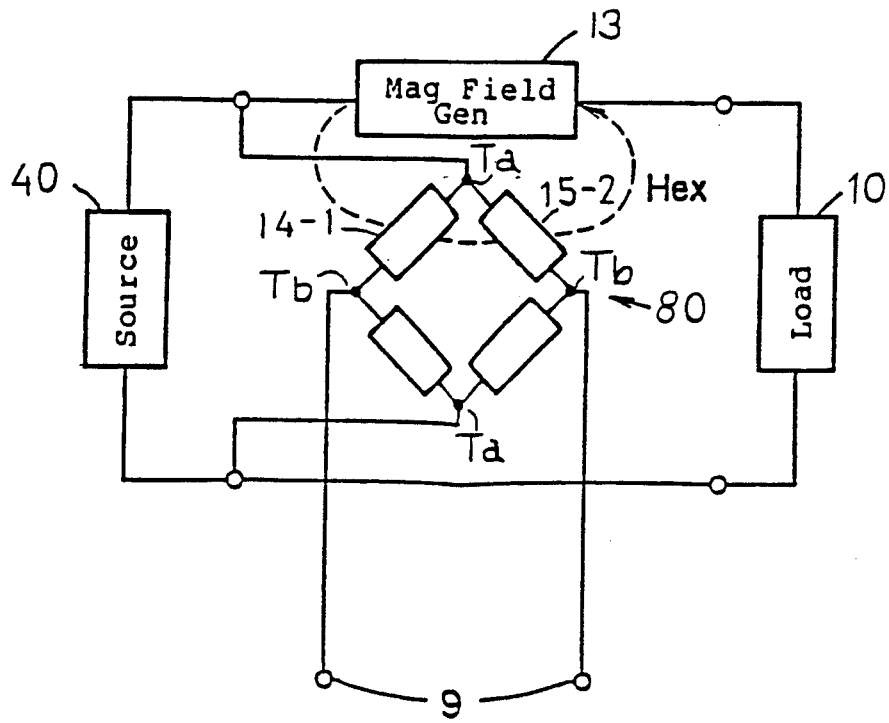
FIG. 6 is a block diagram of a system for measuring electrical power using four magneto-resistive elements in accordance with the present invention.

FIG. 6 is a block diagram of a system for measuring electrical power using four magneto-resistive elements. The FIG. 6 system measures the electric power consumed by a load 10 and provided by a power source 40. A magnetic field generator 13 is inserted in series with the load 10 and source 14. Physically, the magnetic field generator 13 can be a simple coil, or the conductive wire 11 positioned within a through-hole 19 such as illustrated in FIG. 4. It is only necessary that at least one of the magneto-resistive elements be influenced by the magnetic field generator 13, it is not necessary that the conductor 11 be positioned centrally with respect to the bridge elements. FIG. 6 illustrates the magnetic field generator positioned so that the generator magnetic field affects the magneto-resistive elements 14-1 and 15-2.

As seen in FIG. 6, the power source 40 is connected across the terminals Ta. The bridge is adjusted so that no output is detected across terminals Tb in the absence of a magnetic field generated by a magnetic field generator 13. When a load current flows through the magnetic field generator 13 and through the load 10, a magnetic field proportional to this current is generated by the magnetic field generator 13. This causes the resistance of one of the magneto-resistive elements (14-1, 15-2) to increase, while the resistance of the remaining magneto-resistive element decreases. As a result, the bridge becomes unbalanced and an output voltage appears across terminals Tb. In addition, because the bridge is connected across the source 40, the output at terminals Tb is proportional to the voltage of the power source 40. Consequently, the output voltage at terminals Tb is proportional to the product of load current and source voltage, and is therefore proportional to the electric power supplied by the source 40 to the load 10.

Figure 7:
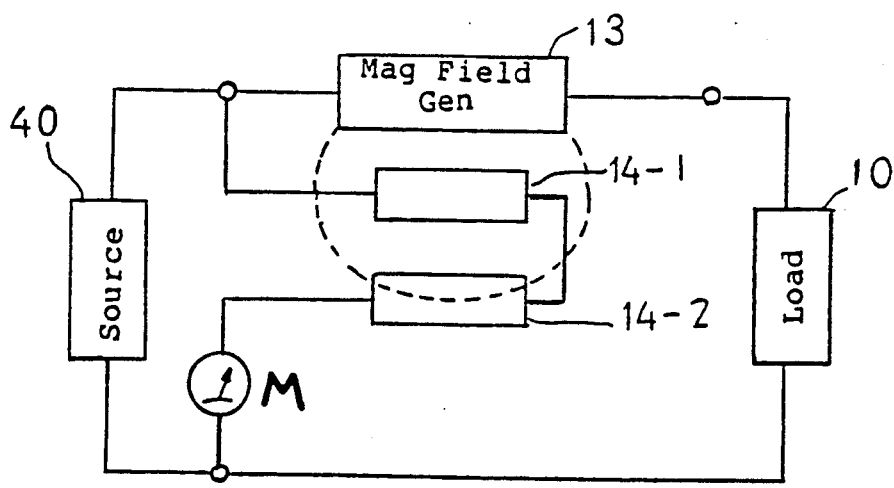
FIG. 7 is a block diagram of a system for measuring electrical power using two magneto-resistive elements in accordance with the present invention.

FIG. 7 is a block diagram of a system for measuring electrical power using two magneto-resistive elements In FIG. 7, the magneto-resistive elements 14-1 and 14-2 are connected in series as in FIG. 5. The two magneto-resistive elements (14-1, 14-2) have the same characteristic A load current flowing through the magnetic field generator 13 changes the resistance of the magneto-resistive elements 14-1 and 14-2, and therefore changes the current through the elements which is detected by the meter M. The current through the elements 14-1 and 14-2 is also affected by the voltage of the power source 40. As a result, the current change through the detector circuit is proportional to the product of load current and source voltages so that the power provided by the source 40 through the load 10 is detected.

In the FIG. 7 circuit, a current flows through the magneto-resistive elements even when the load 10 is disconnected. However, with the bridge circuit shown in FIG. 6, there is no output when the load circuit is disconnected. Therefore, the FIG. 6 is more precise than the FIG. 7 circuit.

The sensing device of the present invention can be embodied using various types of magneto-electric transducers, such as Hall-effect elements and magneto-resistive elements. A basic feature of the invention is that the magneto-electric transducer senses a magnetic field generated by an electric current to be detected. Magneto-resistive elements are preferable to Hall-effect elements because a magneto-resistive elements is a two terminal element compared to the multi-terminal Hall-effect element. Also, many magneto-resistive elements can be formed in intricate patterns using common photolithography techniques.

Figure 8:
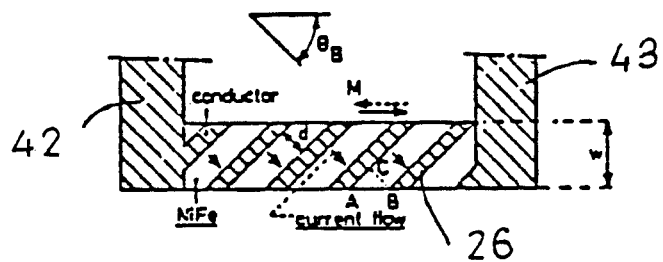
FIG. 8 illustrates a prior art magneto-resistive element.

K. E. Kuijk et al., "The Barber Pole, A Linear Magnetoresistive Head," I.E.E.E. Trans. Magnetics, Vol. Mag-11, No. 5, September 1975, describes a magneto-resistive element commonly called a Barber-Pole type. FIG. 8 illustrates the Barber-Pole type magneto-resistive element which includes slanted strips of a conductor 26, such as gold, patterned on a ferro magnetic material (e.g. Fe-Ni, Co-Ni). The angle of the strips with respect to the axis of magnetization is approximately 45 degrees.

Figure 9:
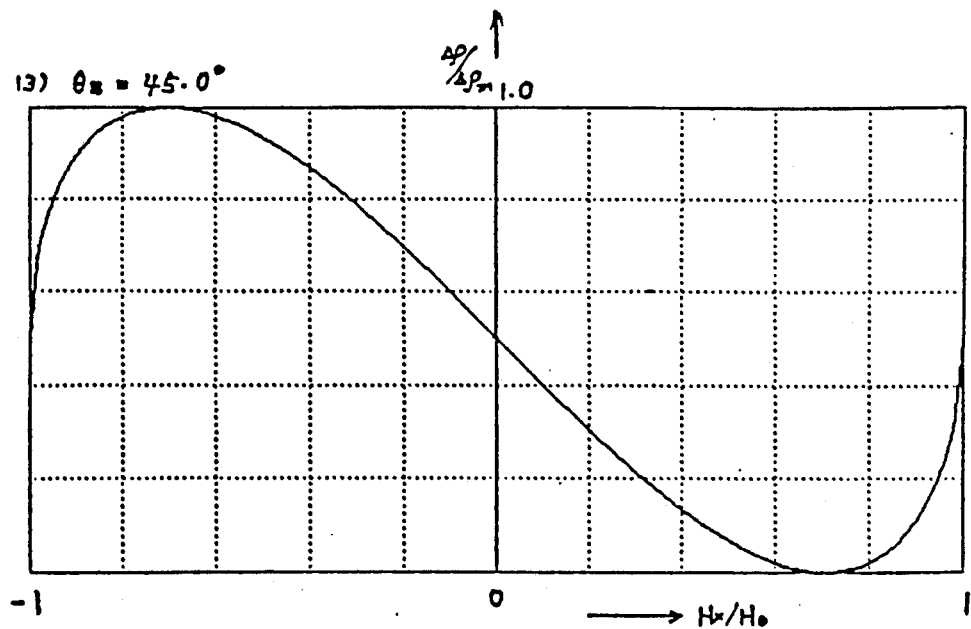
FIG. 9, is a graph illustrating the electrical resistance of the magneto-resistive element shown in FIG. 8.

FIG. 9 is a graph illustrating the electrical resistance between terminals 42 and 43 of the magneto-resistive element shown in FIG. 8. FIG. 9 shows that the electrical resistance is almost linear about the origin $Hx/Ho=0$, wherein Ho represents the saturation field of the magneto-resistive material and Hx represents the magnetic field transverse to the direction identified by the arrow M in FIG. 8.

In FIG. 9, the y-axis represents the ratio of a change in resistivity to a maximum change in resistivity. The slope of the curve in FIG. 9 changes in dependence upon (a) the direction of the applied magnetic field, (b) the slant angle of the Barber-Pole pattern (c) the direction of initial magnetization of the magneto-resistive layer, and (d) the direction of current flow through the magneto-resistive element. Thus, when arranging a plurality of magneto-resistive elements on a substrate to form a sensing device, the slant direction of the Barber-Pole pattern and the direction of initial magnetization are taken into consideration when orienting the individual magneto-resistive elements.

Figure 10:
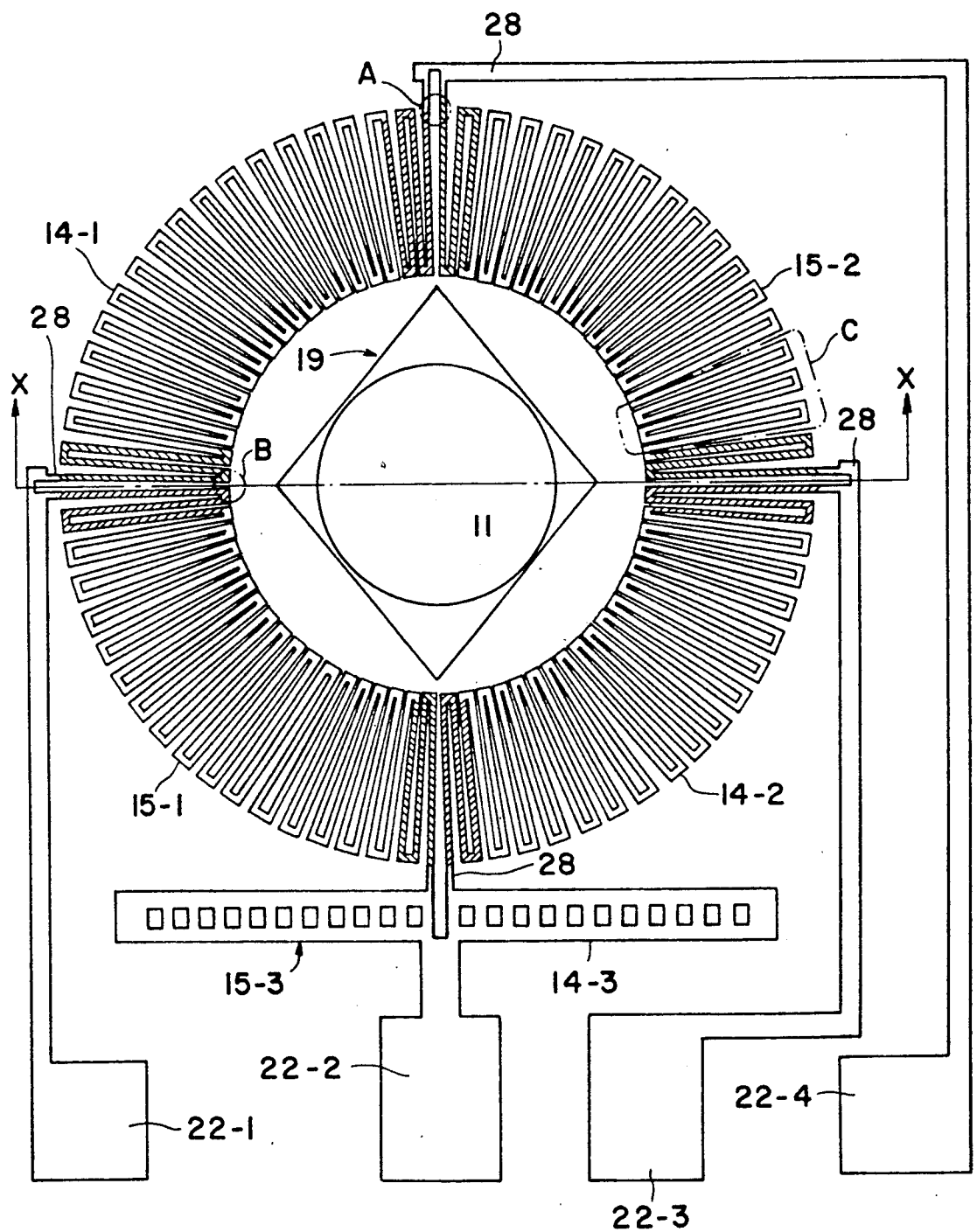
FIG. 10 is a plan view of a pattern of magneto-resistive elements in a bridge circuit embodying the present invention.
Figure 11:
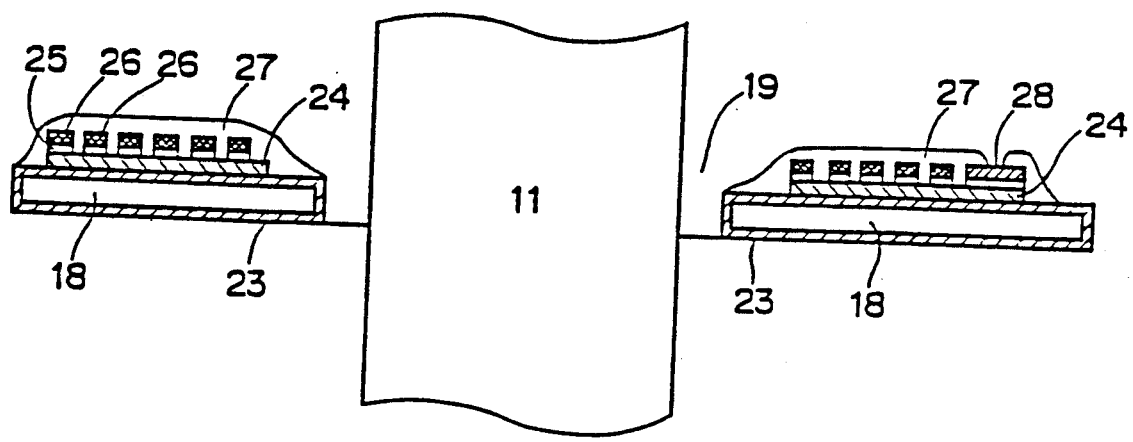
FIG. 11 is a cross-sectional view along the line X—X of FIG. 10.

FIGS. 10 thru 14 illustrate the detailed structure of a sensing device embodying the present invention and corresponding to the configuration shown in FIG. 4. FIG. 10 is a plan view of a pattern of magneto-resistive elements in a bridge circuit embodying the present invention, and FIG. 11 is a cross-sectional view along a line X—X of FIG. 10. As seen from FIGS. 10 and 11, the pattern comprises four magneto-resistive elements 14-1, 14-2, 15-1 and 15-2 formed in a doughnut shape on a substrate 18. The center of the doughnut shaped pattern coinciding with the central point of the substrate 18. Four bonding pads 22-1 through 22-4 are also formed on the substrate 18. Each bonding pad is connected to a point on the pattern corresponding to a vertex of the bridge circuit.

Formation of the patterned magneto-resistive elements is accomplished using known technology, and an example is summarized below. First, an insulating layer 23 such as silicon dioxide (SiO$_2$) is formed on the silicon substrate 18. Next, a thin layer 24 of ferromagnetic material such as permalloy (Fe-Ni) is deposited on the insulating layer 23. The ferromagnetic layer 24 is then patterned using known photolithography techniques to form the zig-zag pattern shown in FIG. 10.

Figure 12:
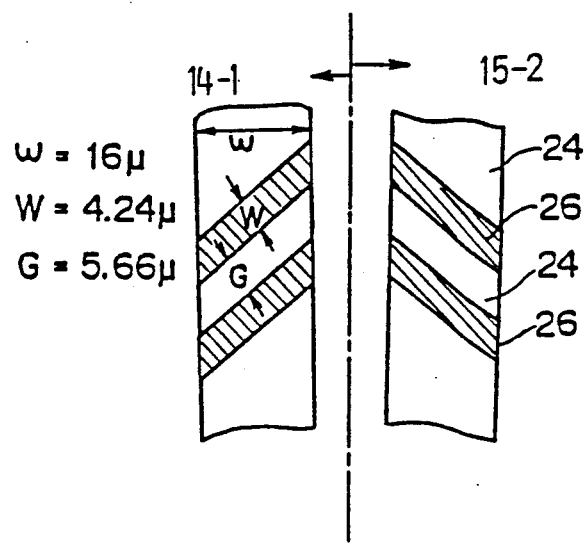
FIG. 12 illustrates the dimensions and orientation of the FIG. 10 pattern.
Figure 13:
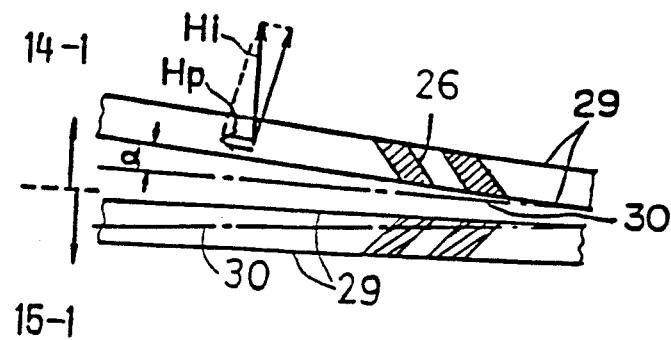
FIG. 13 is an enlarged view of the area B in FIG. 10.

FIG. 12 illustrates the dimensions and orientation of the FIG. 10 pattern, and FIG. 13 is an enlarged view of the area B in FIG. 10. In FIG. 13, each sideline 29 of the permalloy pattern deviates from a dot-dash line 30 by an angle $\alpha$. The line 30 extends radially outward from the center of the through-hole 19. The sidelines 29 of each magneto-resistive element pattern (14-1, 14-2, 15-1, and 15-2) is at an angle $\alpha$ with respect to the line 30. This angle permits the permalloy pattern to be given a desired initial magnetization. More particularly, the permalloy pattern is geometrically anisotropic when formed. To make the pattern electromagnetically anisotropic, an initial magnetization must be given to the pattern. This is achieved by flowing a heavy current through a conductive wire 11 in order to generate a magnetic field Hi therearound. As shown in FIG. 13, the direction of magnetic field Hi is vertical to the line 30, and therefore has an angle $90° - \alpha$ with respect to sideline 29. A component of this magnetic field, Hp, is applied to the strip pattern in the longitudinal direction of the strip pattern. The component Hp has a magnitude equal to $Hi \times \sin \alpha$. When the angle $\alpha$ is assumed to be a few degrees and the magnitude Hi is assumed to be 800 Oe, then the magnitude of Hp is in the range of 4 to 50 Oe and provides the strip pattern with electromagnetic anisotropy.

After completing the above initial magnetization, a contact layer 25 comprising, e.g., Tantalum Molybdenum (TaMo) or Chromium, and a conductive layer 26, such as a gold, are deposited and then patterned. Typical dimensions of the resulting Barber-pole pattern are shown in FIG. 12. As shown in FIG. 12, the orientation of the slanted patterns 26 are reversed for two adjacent elements 14-1 and 15-2. This causes the resistance of these two adjacent elements change in opposite directions when exposed to, for example, the magnetic field generated by the current 12 in the conductive wire 11. The orientation angle or slant angle is usually chosen to be about 45°. This makes the use of a magnetic bias field unnecessary, and provides a linear change of resistance with respect to applied magnetic field.

Four bonding pads 22-1 through 22-4, connecting lines 28 and two adjusting patterns 14-3 and 15-3 are simultaneously formed with the magneto-resistive elements 14-1, 14-2, 15-1 and 15-2. A protective layer 27 is formed on the entire surface. The resistance of the adjusting patterns 14-3 and 15-3 is adjusted to trim the resistance of and to balance the bridge circuit.

Through-hole 19 (FIG. 10) is formed in the substrate 18 before the permalloy deposition process. An anisotropic wet etching process of the (1,1,0) surface of a silicon monocrystal substrate 10 is suitable to form a rhomboid shape hole as shown in FIG. 10.

Figure 14:
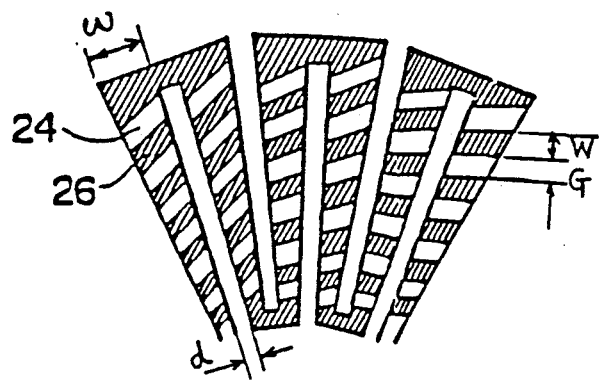
FIG. 14 is an enlarged view of another permalloy pattern corresponding to the area C in FIG. 10.

FIG. 14 is an enlarged view of a different permalloy pattern corresponding to the area C shown in FIG. 10. A gap dimension d between adjacent permalloy strips is almost constant over the entire pattern surface. Consequently, the width w of the permalloy strip 24 gradually increases in a radially outward direction from the center of the through-hole 19 (FIG. 10). Within the pattern, the width W of the conductive layer 26 and the gap G are maintained constant throughout the pattern. As also shown in FIG. 10, the ends of adjacent strips are connected so as to form a zig-zag pattern.

The intensity of the magnetic field generated by a current flowing through the conductive wire 11 gradually decreases in a radially outward direction from the conductive wire 11. An increase in the lateral width w of the permalloy layer 26 compensates for the decrease in the intensity of the magnetic field (FIG. 14). This improves the characteristic of the sensing device.

Figure 15:
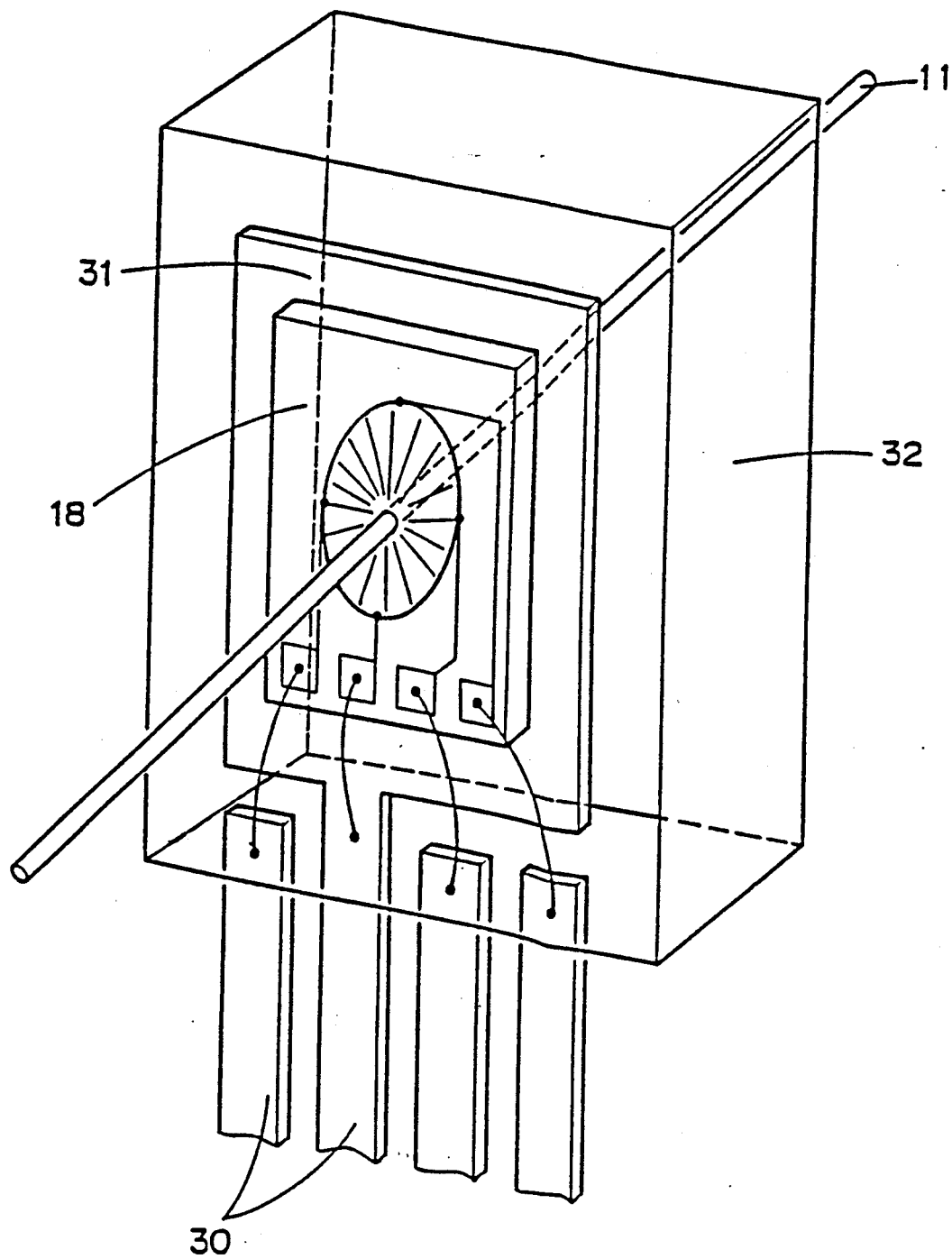
FIG. 15 is a cut-away, perspective view of a sensing device embodying the present invention assembled in a module.

FIG. 15 is a cut-away, perspective view of a sensing device embodying the present invention assembled in a module. In FIG. 15, lead terminals 30 are used to connect the pattern (e.g., as shown in FIG. 10) to an output amplifier and to an input power source. A lead frame 31 fixes the substrate 18 to an exterior frame 32. When the conductive wire 11 is connected to a load circuit, the load current can be measured by detecting the magnetic field around the conductive wire 11 and therefore around the sensing device.

Figure 16:
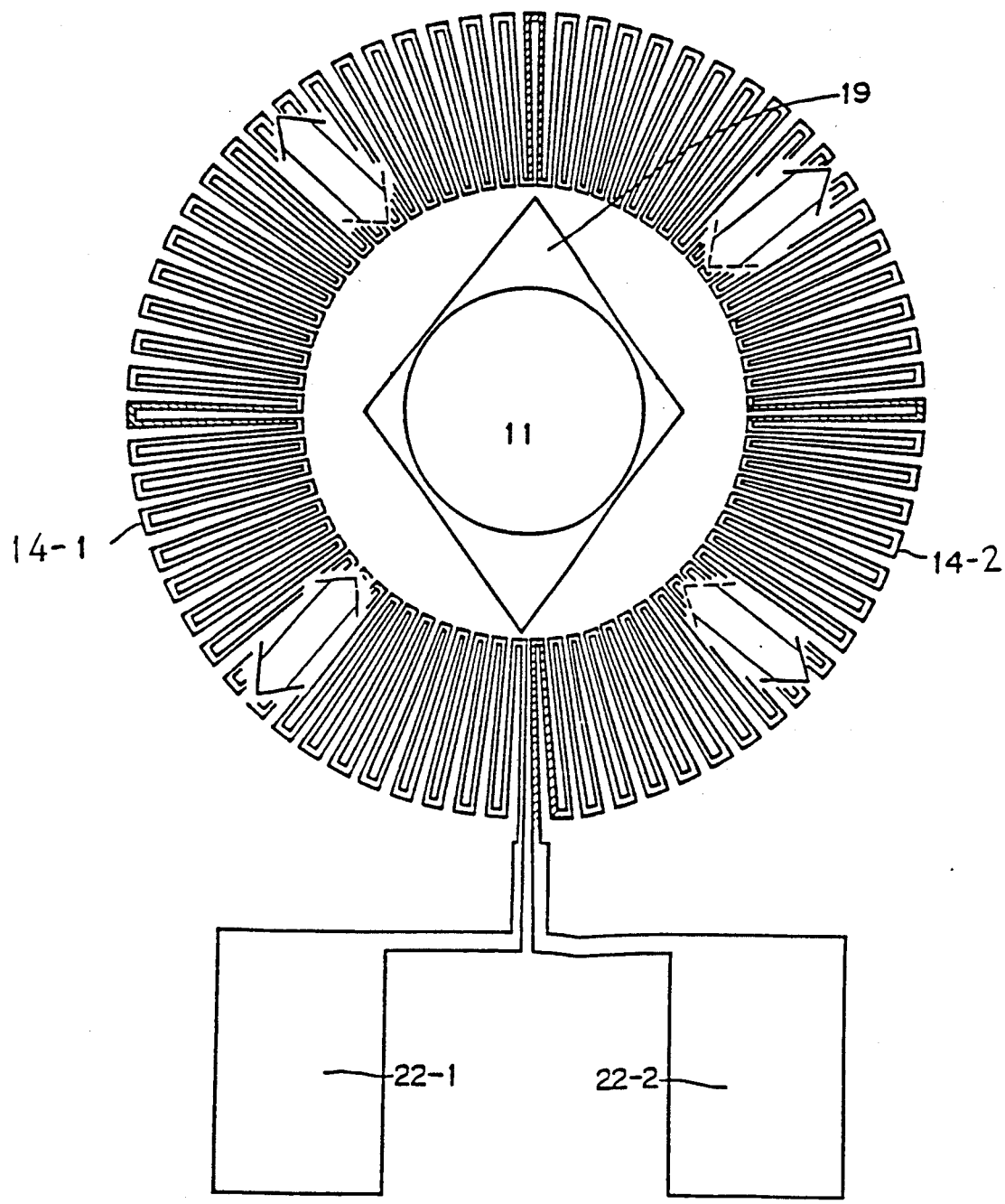
FIG. 16 is a plan view of another pattern of magneto-resistive elements embodying the present invention.

FIG. 16 is a plan view of another pattern of magneto-resistive elements embodying the present invention, and in particular, the physical pattern embodying the circuit illustrated in FIG. 5. The magneto-resistive elements 14-1 and 14-2 are arranged on opposing halves of the doughnut shaped pattern. The initial magnetization of the magneto-resistive elements is either radially outward from, or radially inward toward the center.

Bonding pads 22-1 and 22-2 are connected to a constant current source or to a constant voltage source, and in turn to an amplifier which measures the voltage drop across the bonding pads 22-1 and 22-2. The specific pattern of the permalloy layer shown in FIG. 16 is similar to that shown in FIGS. 12 and 13. That is, the width w of the permalloy strip pattern is constant throughout the pattern. In addition, the sidelines of the strip pattern of magneto-resistive elements 14-1, 14-2, deviate by a small angle as shown in FIG. 13. The Barber-Pole pattern shown in FIG. 14 can also be used in the FIG. 16 pattern. In the FIG. 16 pattern, because the orientation (i.e. slant angle) of the conductive layer 26 of the Barber-Pole pattern is the same for both magneto-resistive elements 14-1 and 14-2, the resistance of each magneto-resistive element changes in the same direction. That is, when influenced by a magnetic field generated about the conductive wire 11, the resistance of the magneto-resistive element 14-1 changes by the same amount and in the same direction as that of the magneto-resistive element 14-2. Measurements using the patterns shown in FIGS. 10 and 16 have been discussed for the case where the conductive wire 11 is positioned within the through-hole 19. However, the sensing device of the present invention can measure electric current flowing through the conductive wire 11 when the conductive wire is positioned parallel to and close to the substrate 18 so that the magnetic field about the conductive wire 11 affects the pattern formed on the substrate 18, as shown in FIGS. 17(a) and 17(b).

Figure 17A:
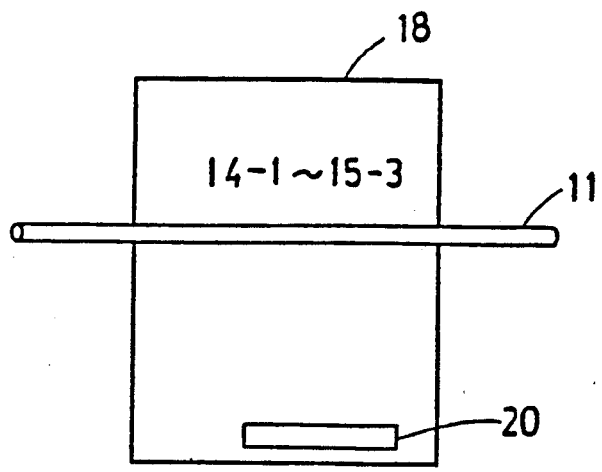
FIGS. 17(a) and 17(b) respectively illustrate a top view and an elevational view of a conductive wire and a sensing device embodying the present invention.
Figure 17B:
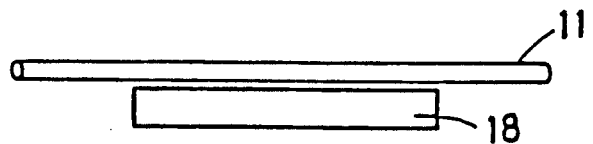

More particularly, FIGS. 17(a) and 17(b) respectively illustrate a top view and an elevational view of a conductive wire and a sensing device embodying the present invention. As stated above, the conductive wire 11 should be fixed parallel to the substrate 18. And in relation thereto so that the magnetic field about the conductive wire 11 affects the magneto-resistive elements formed on the substrate 18. It is preferable (but not required) that the conductive wire 11 pass over the center of the conductive pattern. That is, over the center point of the through-hole 19. While FIGS. 17(a) and 17(b) illustrate a conductive wire 11 having a circular cross-section, wires having a rectangular cross-section can also be used. In fact, rectangular cross-section wires provide a more uniform magnetic field for the magneto-resistive elements formed on the substrate 18. When employing a sensing device in the manner illustrated in FIGS. 17(a) and 17(b), the magnetic field direction across the magneto-resistive elements is in single direction, for example, X-direction or Y-direction only. Therefore, the slant direction of conductive layer 26 of the Barber-pole pattern should be reversed with regard to X-axis or Y-axis depending on the direction of conductive wire 11 above the substrate. When assumed that the conductive wire 11 is placed in an X-direction passing over the center of the substrate 18, the orientation (i.e. slant angle) of conductive layer 26 of the Barber-Pole pattern such as shown in FIGS. 12, 16 and etc. should be reversed with regard to X-axis in this case.

Figure 18:
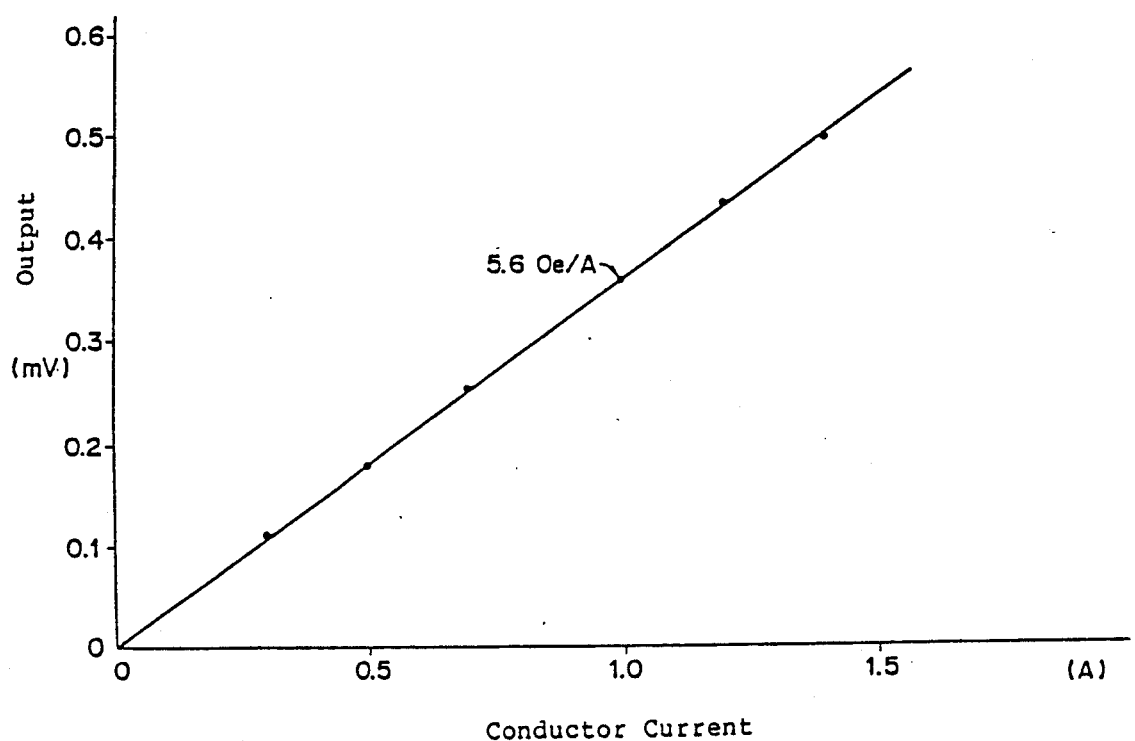
FIG. 18 is a graph illustrating a test result of electric current measurement using the present invention.

FIG. 18 is a graph illustrating electric current measurements using a device having the bridge pattern shown in FIG. 10 arranged as in FIGS. 17(a) and 17(b) with a gap of 0.4 mm between the conductive wire 11 and the substrate 18 In FIG. 18, the abscissa represents the electric current being measured and the ordinate represents the output of an amplifier having an amplification factor of 100. The results shown in FIG. 18 were obtained with a current of 5 mA flowing through the bridge circuit. As seen in FIG. 18, the slope of the line is 5.6 Oe/A.

To increase the sensitivity of measurements, several devices embodying the present invention can be used. For example, a plurality of magneto-resistive elements formed in a doughnut shape on a substrate can be arranged about a conductive wire 11 and mutually connected so as to improve the sensitivity of current detection. One such arrangement would have a plurality of devices such as illustrated in FIG. 15 arranged to have the conductive wire 11 positioned within the through-hole 19 of each device. The outputs of the individual devices are then combined so that the overall sensitivity of the detection is multiplied by the number of devices used. When employing a device embodying the present invention in a manner such as shown in FIG. 17(a) and 17(b), two sensing devices can be disposed on opposing sides of a conductive wire. Thus, the sensitivity is doubled. In addition, the conductive wire 11 can be formed in a coil shape above the pattern. This increases the magnetic field intensity applied to the magneto-resistive pattern formed on the substrate 18.

As noted above, the pattern shown and 16 must be provided with an initial magnetization having a direction which is either radially outward from or radially inward toward the center of the through-hole 19. The initial magnetization operation discussed with respect to FIG. 13 is an effective but cumbersome process. While an electromagnet having one pole arranged at the center of the pattern shown in FIG. 10 can be used, this is also an effective but troublesome method.

Figure 19:
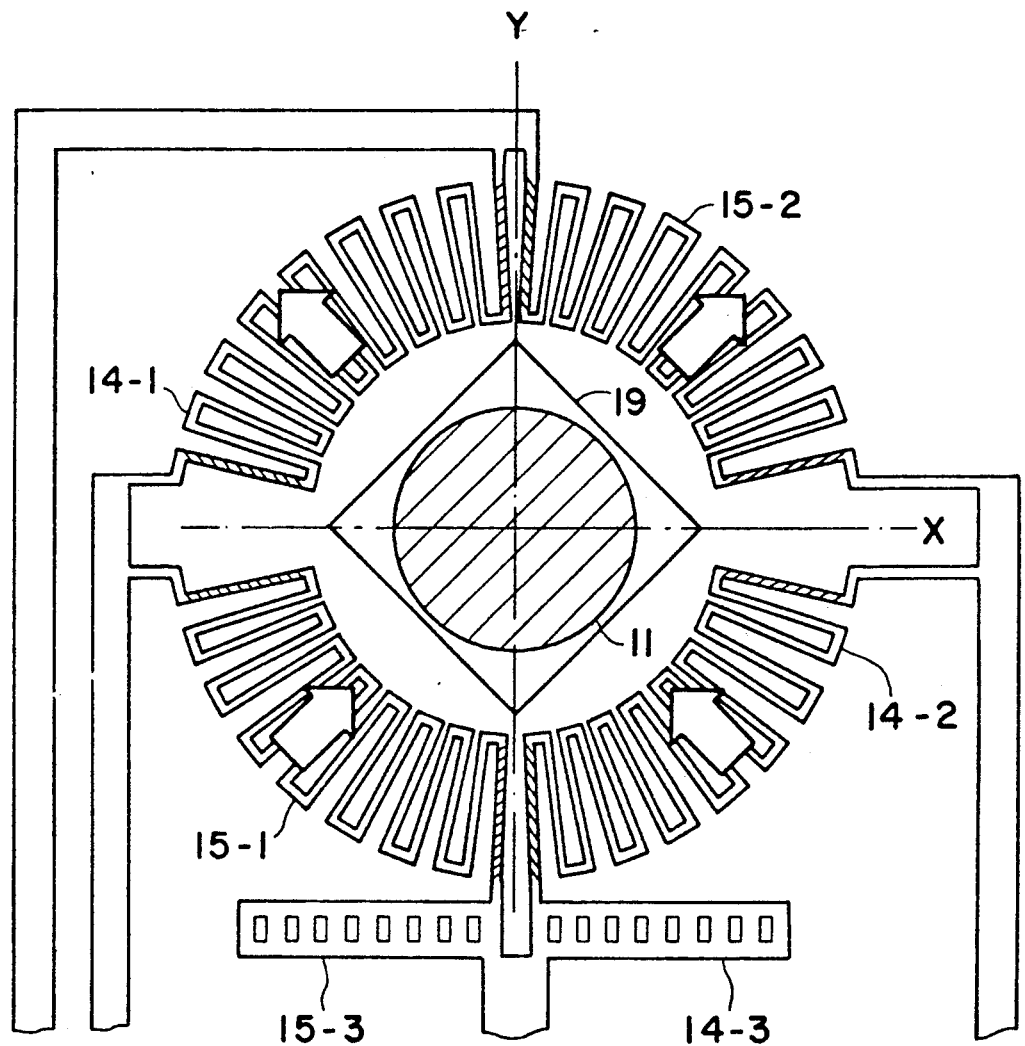
FIG. 19 schematically illustrates an initial magnetization, using a pattern similar to that of FIG. 10.
Figure 20:
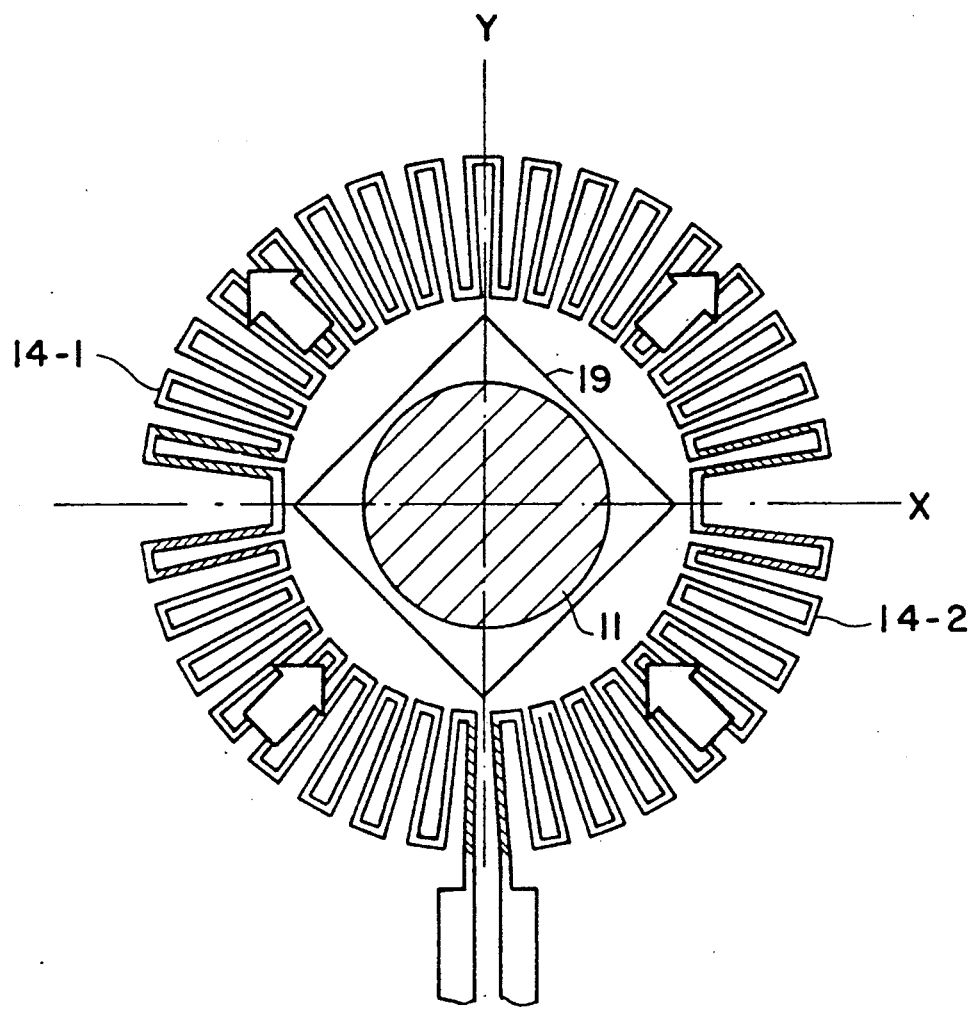
FIG. 20 schematically illustrates an initial magnetization, using a pattern similar to that of FIG. 16.

FIG. 19 schematically illustrates an improved initial magnetization for a pattern similar to that of FIG. 10. In FIG. 19, the direction of the initial magnetization for the magneto-resistive elements 14-2 and 15-1 is in a radially inward direction, and the initial magnetization direction for the magneto-resistive elements 14-1 and 15-2 is in a radially outward direction. FIG. 20 illustrates a similar initial magnetization for the pattern shown in FIG. 16.

In FIGS. 19 and 20, the direction of the initial magnetization for the magneto-resistive elements reverses about the X axis. As a result, the direction of the initial magnetization is unstable and uncertain for the magneto-resistive patterns close to the X axis. Therefore, the pattern of the Barber-Pole type magneto-resistive elements is modified as shown in FIGS. 19 and 20.

To induce the initial magnetization directions shown in FIGS. 19 and 20, opposing poles of an electromagnet or permanent magnet are placed symmetrically with respect to the X axis and close to the patterns shown in FIGS. 19 and 20. Because of the direction of the initial magnetization is different for respective areas of the patterns shown in FIGS. 19 and 20, the direction of any change in resistivity of the respective magneto-resistive elements also changes. Therefore, the orientation direction of the Barber-Pole pattern should be changed in order to maintain the same characteristics for the sensing units as in the respective patterns of FIGS. 10 and 16. For example, the orientation direction of the conductive pattern 26 in the fourth quadrant of the pattern shown in FIG. 19 is opposite that of the pattern shown in the fourth quadrant of the FIG. 10 pattern.

In order to obtain precise current measurements, the conductive wire 11 should be in the center of the through-hole 19, firmly fixed with respect to the substrate 18 and perpendicular to the substrate 18. These requirements are difficult to meet In addition, it is difficult to position a conductive wire 11 within a through-hole 19 each time that a measurement is desired. In order to alleviate these problems, it is desirable to provide a conductive layer within the through-hole 19, and conductive pads that are connectable to the load circuit. FIG. 21 is a partial, cross-sectional view of a through-hole formed with such a conductive layer. In FIG. 21, reference numeral 18 represents a silicon substrate with a magneto-resistive element formed thereon A circular hole 45 is formed in the substrate 18. A metal layer 46 coats the inside surface of the hole 45, and pads 46-1 and 46-2 are provided on the surface of the substrate 18 in order to connect the middle layer 46 to a load circuit.

Silicon monocrystals have anisotropic etching characteristics when subject to a heated alkali solution. This is because the etching speed of the silicon monocrystal is dependent upon the surface orientation of the crystal. The surfaces (1,0,0,) and (1,1,0) have high etching speeds. However, the surface (1,1,1) has a low etching speed Therefore, when a silicon substrate is subject to the anisotropic etching, the surface (1,1,1) is not significantly etched with respect to the other surfaces. Therefore by using a silicon wafer having a proper surface orientation and selectively aligning a sideline of the mask pattern with the direction of the crystal axis, a symmetrical perforation (e.g through-hole 19 or 45) can be formed in the silicon substrate via anisotropic etching.

FIGS. 22(a) through 22(c) respectively illustrate a top view, a bottom view, and a partial, cross-sectional view of a through-hole in a silicon substrate formed by an anisotropic etching process. A pyramid shaped perforation 47 shown in FIG. 22(c) is formed in the following matter. A silicon monocrystal substrate 18 having a (1,0,0) surface is subjected anisotropic etching. The substrate 18 has a square mask pattern thereon wherein a sideline thereof is aligned with the <1,0,0> direction of the silicon substrate. Subjecting this substrate to an anisotropic etching results in formation of the pyramidal shaped perforation 47 shown in FIG. 22(c) After formation of the perforation 47, a middle layer 46 is deposited on the inner surface of the perforation 47 together with pad portions 46-1 and 46-2 as shown in FIG. 22(a).

Details of an example manufacturing process are as follows.

(a) Silicon substrate 18 is subjected to thermal oxidization so as to form a silicon dioxide layer having a thickness in the range of 0.5 to 1.0 um.

(b) A square opening is formed in the silicon dioxide layer using any common photolithography technique. The opening is formed so that one side of the square is parallel with the direction <1,1,0> of the silicon substrate 18.

(c) The substrate is subjected to anisotropic etching to form the perforation 47. The angle of the perforation is about 55° with respect to the silicon surface. The pyramidal shaped opening 47 has a comparatively large top opening 47-1 and a small bottom opening 47-2 as shown in FIG. 22(a) The anisotropic etching can be performed using a etching solution comprising a mixture of ethylene diamine 255 cc, H2O 120 cc, and catechol 46 gr heated to a temperature in the range of 100° to 110° C.

(d) After forming the magneto-resistive elements, the perforation 47 is covered with the metal layer 46.

An alternate method for forming a perforation is explained with reference to FIGS. 23(a) through 23(d). FIG. 23(a) is a top view of the substrate 18; FIG. 23(b) is a bottom view of the substrate 18; FIG. 23(c) is a partial, cross-sectional view of the substrate 18 along the line A—A of FIG. 23(a); and FIG. 23(d) is a cross-sectional view of the substrate 18 along the line B—B of FIG. 23(a).

In this method, the silicon monocrystal substrate 18, having (1,1,0) surface, is subjected to anisotropic etching so as to form a rhombus shaped perforation. To do so, a rhombus shaped mask pattern is aligned with the direction <1,1,1> of silicon substrate 18. During the anisotropic etching, the silicon substrate is etched to form a perforation having a rhombus shape 48-1 as shown in the top view in FIG. 23(a), and a hexagon shape 48-2 as shown in the bottom view in FIG. 23(b). The hexagon shape 48-2 is also seen in the top view FIG. 23(a). The metal layer 46 and pad portions 46-1 and 46-2 are deposited on the inner wall of the perforation, and on both sides of the silicon surfaces near the perforation, as shown in FIGS. 23(c) and 23(d).

Figure 24:
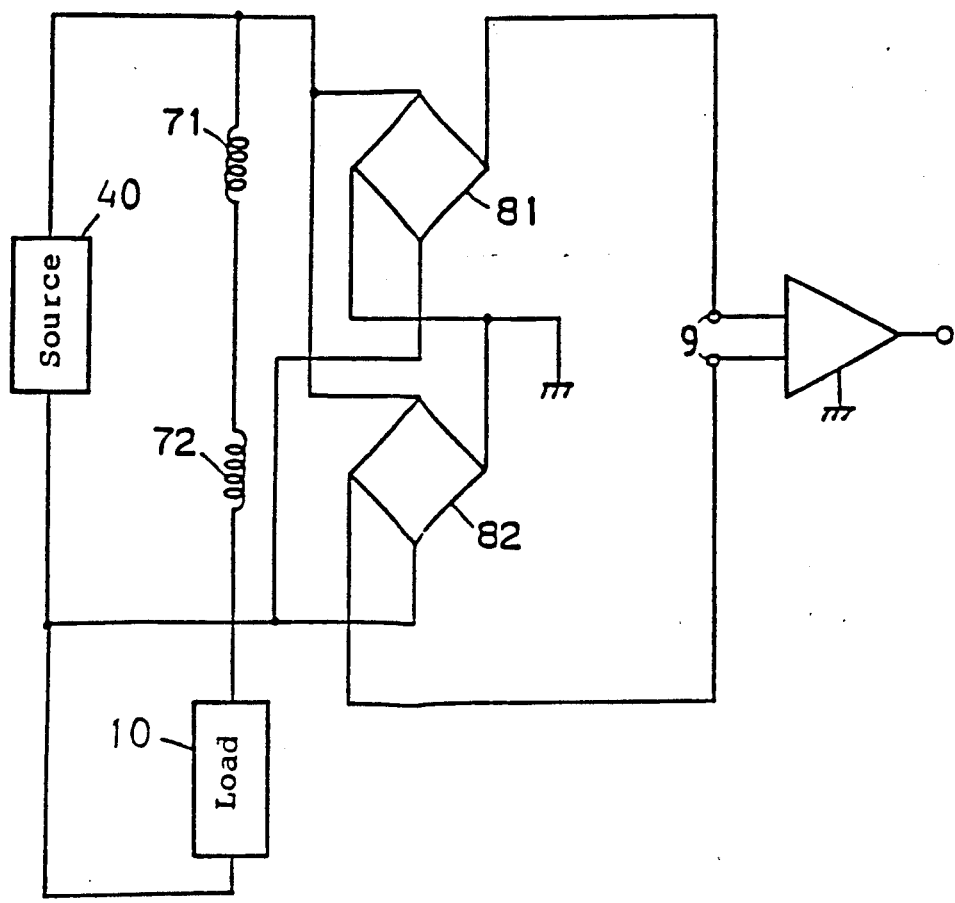
FIG. 24 is a block diagram of a system for measuring electric power using two sensing devices embodying the present invention.

As discussed with reference to FIGS. 6 and 7, the sensing device of the present invention can be used detect and measure the electric power delivered from a source to a load. FIG. 24 is a block diagram of a system for measuring electric power using two sensing devices embodying the present invention. A sensing device 81 and a sensing device 82 are connected across a source 40. The power source 40 supplies an electric current to the load 10 through coils 71 and 72. The two coils 71 and 72 are disposed so that the direction of magnetic field generated by one coil is opposite that generated by the other coil. If the polarity of the sensing devices 81 and 82 are opposite (i.e. the orientation of the Barber-Pole stripes is selected so that their resistivity changes in opposite directions), then aligning these devices with respective ones of the coils 71 and 72 provide an output that is double of that obtained by one sensing device. The output of the system shown in FIG. 24 is not affected by the ambient magnetic field (i.e. the earth's magnetic field).

Figure 25:
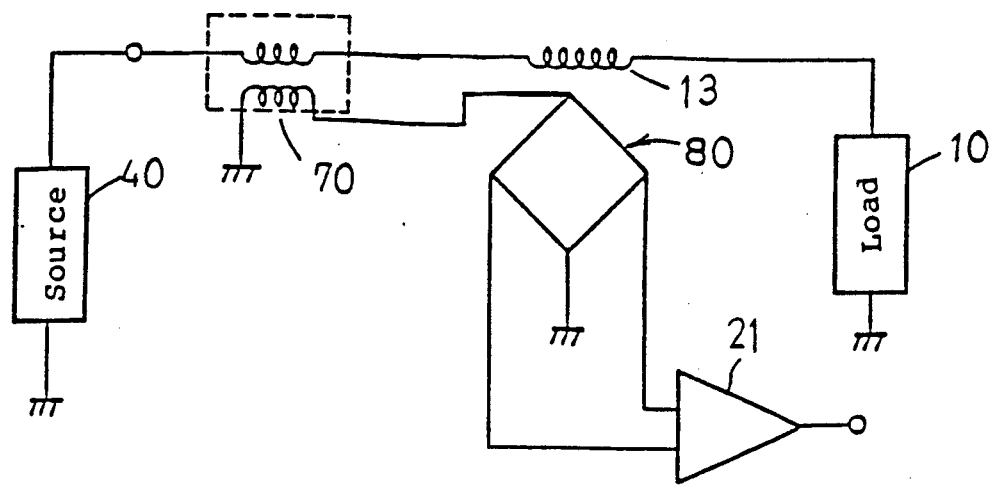
FIG. 25 is a circuit diagram of a circuit for measuring power in a load generated by a high voltage alternating current.

FIG. 25 is a circuit diagram of a circuit for measuring power in a load generated by a high voltage alternating current. In FIG. 25, reference numeral 70 identifies an isolation or insulation transformer. The isolation transformer reduces the high voltage to an appropriate value that can be sensed by the sensing device 80. This circuit is particularly useful when it is desired to ensure that the sensing device 80 is insulated from the high voltage source.

Figure 26A:
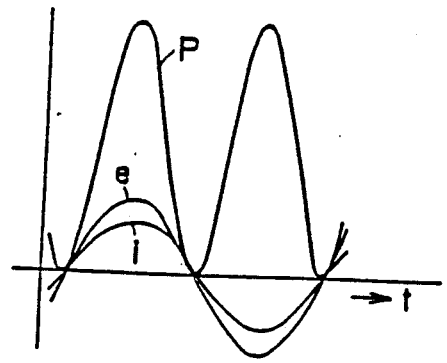
FIG. 26(a) is a graph illustrating a voltage, current and power measured employing a circuit embodying the present invention.

FIG. 26(a) is a graph illustrating a measurement of power supplied to a pure resistive load using a device embodying the present invention. In FIG. 26(a), the current i is in phase with the voltage e The electric power P, which is the product of the voltage v and the current i has a frequency that is double the frequency of the voltage and current.

Figure 26B:
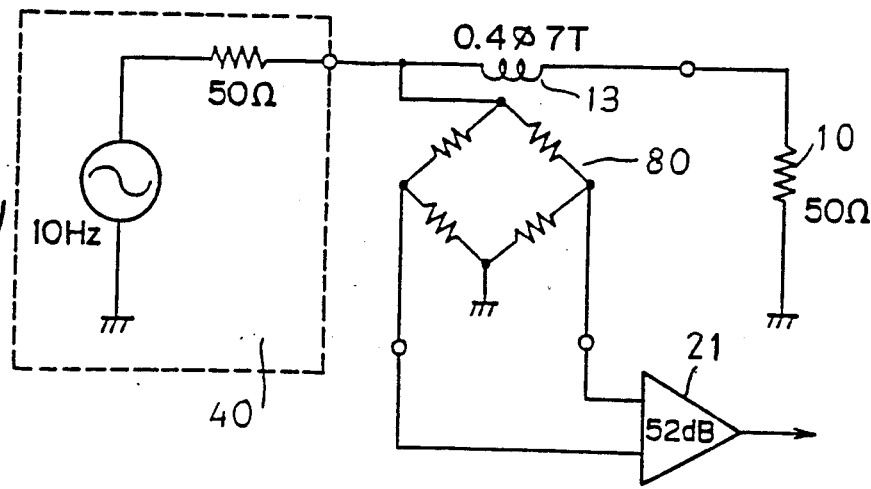
FIG. 26(b) is a circuit diagram of a circuit for measuring power in a pure resistive load driven by an AC power source.
Figure 26C:
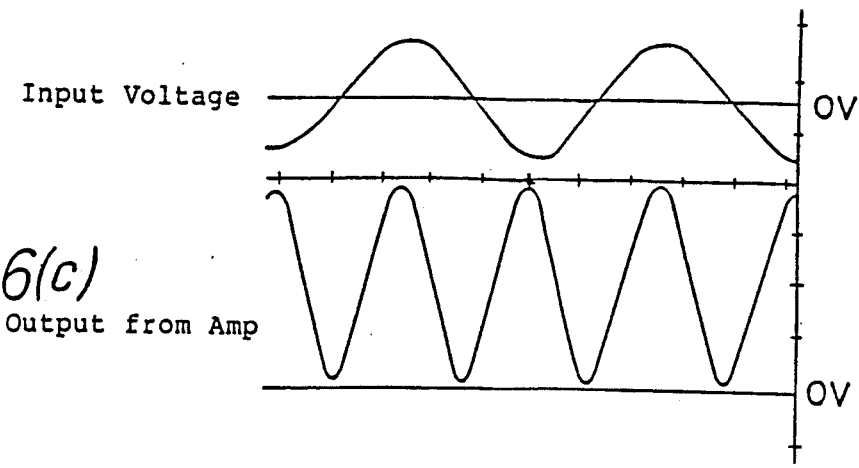
FIG. 26(c) is a graph illustrating the input and output of the FIG. 26(b) circuit.

FIG. 26(b) is a circuit diagram illustrating a circuit for measuring the power delivered by a 10 Hz alternating power source having a 50 Ohm impedance to a 50 Ohm load 10. The magnetic field generating means 13 comprises a 7 turn coil of 0.4 mm diameter wire. The amplifier 21 has a gain of approximately 52 dB. FIG. 26(c) is a graph illustrated the output of amplifier 21 and the voltage supplied by the source 40. The output of amplifier 21 has a frequency that is twice that of the input voltage.

Figure 27A:
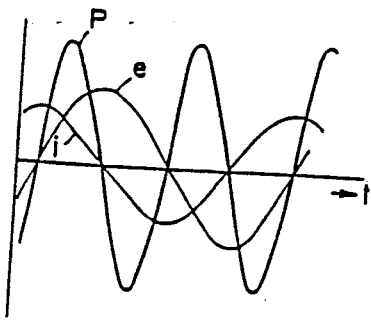
FIG. 27(a) is a graph illustrating a voltage, current and power measured employing a circuit embodying the present invention.

As is well known, when a load is not a pure resistance load, and instead can be characterized as an inductance load or a capacitance load, then the phase of the load current respectively lags or leads the load voltage. As a consequence, the power waveform fluctuates between a positive value and a negative value as shown in FIG. 27(a). In FIG. 27(a) the current waveform i leads to the voltage e by 90°. As with the other circuits, the power waveform P has a frequency that is double that of the voltage and current waveforms. In addition, the power waveform P varies between negative and positive values.

Figure 27B:
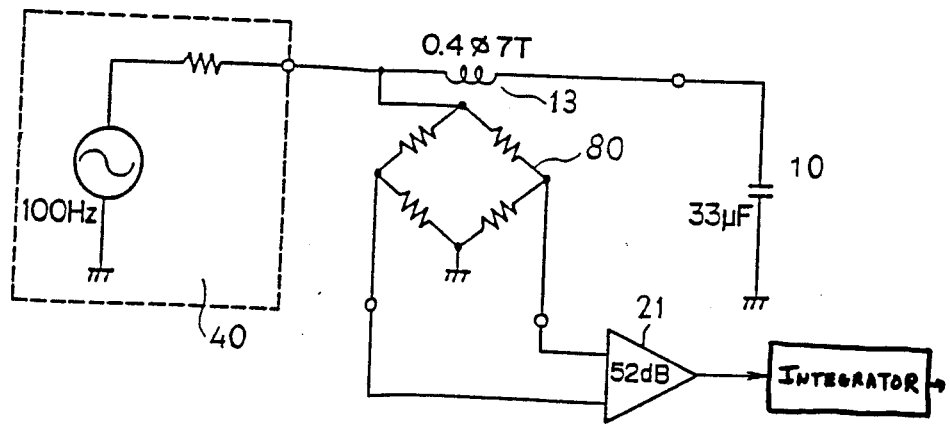
FIG. 27(b) is a circuit diagram of a circuit for measuring the electric power in a capacitive load driven by an AC power source embodying the present invention.
Figure 27C:
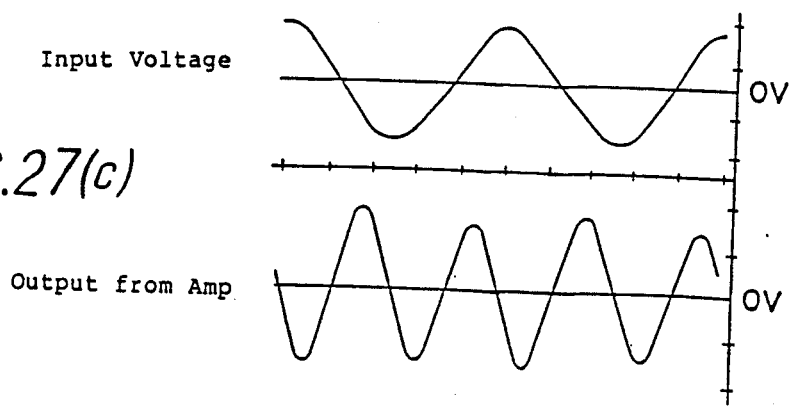
FIG. 27(c) is a graph illustrating the input and output of the FIG. 26(b) circuit.

FIG. 27(b) illustrates a circuit used to measure the power delivered by a 100 Hz power source 40 to a capacitive load 10. In FIG. 27(b), the magnetic field generating means 13 comprises 7 turns of 0.4 mm diameter wire. FIG. 27(c) is a graph illustrating the output of amplifier 21 of FIG. 27(b) As shown in the figure, the power varies between positive and negative values. When this waveform is integrated, the resulting signal indicates the effective power delivered to the load 10, in this case, zero.

The sensing device of the present invention is compact and has no moving parts. The frequency sensitivity of the inventive sensing device is superior to that of existing sensing devices.

While the sensing device of the present invention has been described in terms of particular embodiments, the sensing device is not limited to the disclosed embodiments. Instead, the scope of the sensing device of the present invention is defined by the following claims.

What is claimed is:

1. A device for sensing a magnetic field due to a current in a conductor comprising:
   a substrate; and
   a plurality of Barber-Pole magneto-resistive elements, disposed on said substrate, each of said Barber-Pole magneto-resistive elements comprising:
   a plurality of strips, each of said strips being formed in a direction substantially along a radius emanating from a central point of said substrate and being connected to an adjacent one of said strips so as to form a zig-zag pattern, said plurality of Barber-pole resistive elements being arranged in a ring with adjacent ones of said elements arranged side by side and connected to each other; and
   a pair of output terminals formed on said substrate and connected to selected ones of said Barber-pole magneto-resistive elements.

2. A sensing device according to claim 1, wherein each of said strips has an angle of $\leq 5°$ with respect to the radius.

3. A sensing device according to claim 1, wherein each of said strips has a substantially constant width.

4. A sensing device according to claim 1, wherein each of said strips has a width that increases in a direction away from the central point.

5. A sensing device according to claim 1, wherein each of said magneto-resistive elements has an initial magnetization direction oriented substantially along the radius.

6. A sensing device according to claim 5, wherein each of said initial magnetization direction is selected to be one of: toward the central point and radially outward from the central point.

7. A sensing device according to claim 5, wherein said initial magnetization directions for adjacent Barber-Pole magneto-resistive elements are respectively towards the central point and radially outward from the central point.

8. A sensing device according to claim 1, wherein each of said Barber-pole magneto-resistive elements has an initial magnetization direction oriented substantially along a radius emanating from the central point.

9. A sensing device according to claim 8, wherein each of said initial magnetization direction is selected to be one of: toward the central point and radially outward from the central point.

10. A sensing device according to claim 8, wherein said initial magnetization directions for adjacent Barber-Pole magneto-resistive elements are respectively towards the central point and radially outward from the central point.

11. A sensing device according to claim 2, wherein each of said Barber-pole magneto-resistive elements has an initial magnetization direction oriented substantially along the radius.

12. A sensing device according to claim 11, wherein each of said initial magnetization direction is selected to be one of: toward the central point and radially outward from the central point.

13. A sensing device according to claim 12, wherein said initial magnetization directions for adjacent Barber-Pole magneto-resistive elements are respectively towards the central point and radially outward from the central point.

14. A sensing device according to claim 3, wherein each of said Barber-pole magneto-resistive elements has an initial magnetization direction oriented substantially along the radius.

15. A sensing device according to claim 14, wherein each of said initial magnetization direction is selected to be one of: toward the central point and radially outward from the central point.

16. A sensing device according to claim 14, wherein said initial magnetization directions for adjacent Barber-Pole magneto-resistive elements are respectively towards the central point and radially outward from the central point.

17. A sensing device according to claim 4, wherein each of said Barber-pole magneto-resistive elements has an initial magnetization direction oriented substantially along the radius.

18. A sensing device according to claim 17, wherein each of said initial magnetization direction is selected to be one of: toward the central point and radially outward from the central point.

19. A sensing device according to claim 17, wherein said initial magnetization directions for adjacent Barber-Pole magneto-resistive elements are respectively towards the central point and radially outward from the central point.

20. A sensing device according to claim 1, wherein said substrate has a through-hole formed therein for accepting the conductor, said through-hole being formed inside the ring of said Barber-pole magneto-resistive elements.

21. A sensing device according to claim 4, wherein said substrate has a through hole formed therein, said through-hole positioned about the central point, and said sensing device further comprising:
   conductive layer positioned on said substrate about said through-hole and within said through-hole.

22. A sensing device according to claim 1, wherein said plurality of Barber-pole magneto-resistive elements is connected in series and at least a pair of said elements is connectable to an outside circuit.

23. A sensing device according to claim 1, wherein said plurality of Barber-pole magneto-resistive elements are connected as a bridge circuit with a pair of input terminals connectable to a source and a pair of output terminals.

24. A sensing device according to claim 23, wherein the output terminals are connectable to a load having a current flowing therethrough, and said device further comprises:

means for providing the current, wherein a resistance of said magneto-resistive elements varies in response to the current.

25. A sensing device according to claim 1, wherein said magneto-resistive elements are connected in series.

26. A sensing device according to claim 22, wherein the input terminals are connectable to a power source which is connected to a load providing a current to the conductor; and wherein the output terminals are connectable to provide a voltage proportional to a magnetic field about the conductor.

27. A sensing device according to claim 23, further comprising:
amplifier means connected to the output terminals for providing an output.

28. A sensing device according to claim 27, further comprising:
integrator means for integrating said output and for providing a signal varying in accordance with said integration.

29. A sensing device according to claim 1, wherein said conductor carrying an electric current is closely disposed to said substrate surface parallel thereto.

30. A sensing device according to claim 29, wherein said conductor has a rectangular cross-section.

31. A sensing device according to claim 24, further comprising:
means for providing a load voltage, wherein said bridge circuit is connected so that the voltage responsive to both said load current and said load voltage appears across said bridge circuit.

32. A sensing device according to claim 20, wherein said substrate comprises silicon material and said through-hole is formed by an etching technology thereto.

33. A sensing device according to claim 32, wherein said through-hole is formed by a wet anisotropic etching technology.

34. A sensing device according to claim 33, wherein said through-hole has a rhombus shape on a first surface of said silicon substrate and a hexagon shape on a second surface thereof, thereby (1,1,0) silicon surface utilized.

35. A sensing device according to claim 33, wherein said through-hole has a pyramid shape within the silicon substrate, thereby (1,0,0) silicon surface utilized.

* * * * *

UNITED STATES PATENT AND TRADEMARK OFFICE
CERTIFICATE OF CORRECTION

PATENT NO. : 5,049,809
DATED : September 17, 1991
INVENTOR(S) : Wakatsuki et al.

It is certified that error appears in the above-identified patent and that said Letters Patent is hereby corrected as shown below:

```
Col. 10, line 12, "shown and" should be --shown in
      Figs. 10 and--.

Col. 14, line 12, "12" should be --11--.
```

Signed and Sealed this

Twelfth Day of January, 1993

Attest:

DOUGLAS B. COMER

Attesting Officer     Acting Commissioner of Patents and Trademarks